(12) United States Patent
Boller et al.

(10) Patent No.: US 6,568,581 B2
(45) Date of Patent: May 27, 2003

(54) DETECTION OF WIRE BONDING FAILURES

(75) Inventors: Michael Armin Boller, Singapore (SG); Baskaran Annamalai, Singapore (SG); Keng Yew Song, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 09/808,803

(22) Filed: Mar. 15, 2001

(65) Prior Publication Data

US 2002/0130158 A1 Sep. 19, 2002

(51) Int. Cl.⁷ .................. B23K 31/12; B23K 37/00; B23K 31/02
(52) U.S. Cl. .............. 228/103; 228/4.5; 228/180.5; 228/1.1
(58) Field of Search .............. 228/103, 4.5, 180.5, 228/1.1; 219/56.21; 73/588

(56) References Cited

U.S. PATENT DOCUMENTS

| | | | | |
|---|---|---|---|---|
| 4,327,354 A | * | 4/1982 | Persoon | 382/155 |
| 4,555,052 A | * | 11/1985 | Kurtz et al. | 219/56.21 |
| 4,558,596 A | * | 12/1985 | McBrearty et al. | 228/1.1 |
| 4,586,642 A | * | 5/1986 | Dreibelbis et al. | 228/104 |
| 4,606,490 A | * | 8/1986 | Chan et al. | 228/103 |
| 4,808,948 A | * | 2/1989 | Patel et al. | 156/73.2 |
| 4,984,730 A | * | 1/1991 | Gobel et al. | 228/1.1 |
| 5,058,797 A | | 10/1991 | Terakado et al. | |
| 5,275,058 A | * | 1/1994 | Pham et al. | 324/538 |
| 5,328,079 A | | 7/1994 | Mathew et al. | |
| 5,591,920 A | * | 1/1997 | Price et al. | 228/4.5 |
| 5,832,412 A | * | 11/1998 | Guez | 310/322 |
| 5,889,210 A | * | 3/1999 | Inoue | 73/588 |
| 6,452,502 B1 | * | 9/2002 | Dishongh et al. | 340/653 |
| 2002/0028524 A1 | * | 3/2002 | Koduri | 438/14 |

\* cited by examiner

Primary Examiner—Tom Dunn
Assistant Examiner—L. Edmondson
(74) Attorney, Agent, or Firm—Senniger, Powers, Leavitt & Roedel

(57) ABSTRACT

A device for monitoring a wire bonding process measures an electric signal applied to a bond wire during the bonding process, and generates an output which discriminates between successful and unsuccessful bonding. The device employs at least one variable parameter. The value of the variable parameter is determined beforehand in a learning process by monitoring examples of actual wire bonding operations. Thus, the detection method may adapt to changing requirements automatically and operate under optimal conditions for a large variety of circuits to be processed. The electric signal is preferably oscillating, and the measurement preferably includes its peak or RMS amplitude.

27 Claims, 3 Drawing Sheets

DETECTION OF WIRE BONDING FAILURES

FIELD OF THE INVENTION

The present invention relates to methods and apparatus for detecting failures made by a wire bonding system which forms a wire bond between two contact surfaces. For example, one contact surface may be a pad of a die and the other contact surface may be a point on a substrate (the term "substrate" will be used in this document broadly to include a substrate on which a die is mounted or a lead frame), a different pad of the same die, or a pad of a second die.

SUMMARY OF THE PRIOR ART

It is known to equip an automatic wire bonding machine with a device to detect defects which arise during the wire bonding process. This is particularly necessary for the first bond on the die and for the second bond on the substrate. There are several known ways to detect defects.

One possible way, in the case that the bonding machine employs ultrasonic bonding, is to monitor during the bonding process one or more signals from the ultrasonic system, and to deduce from a comparison between waveforms of the ongoing bond with waveforms of known good bonds whether a failure has occurred or not (U.S. Pat. No. 5,889,210).

Another method is to inject a DC voltage signal into the bond wire and to monitor changes of this signal during and/or after the bonding process (U.S. Pat. Nos. 4,555,052; 5,058,797). This method essentially evaluates changes in the impedance between the bond wire and a reference point, which is usually the chassis ground of the machine.

By contrast, U.S. Pat. No. 4,586,642 electrically couples an oscillator to the bond wire. During the bonding process the capacitance of the bonded system changes, which changes the frequency of the signal. Bonding failures are observed from measurements of the frequency at various stages of the operation.

There are a great variety of die and substrate designs on the market and the requirements on the properties of the injected signal, and the changes which this signal undergoes when it is connected to the die or the substrate, vary over a wide range. Semiconductor manufacturers are generally concerned that the signal applied might cause degradation or even damage to the chip if the signal amplitude is too high. On the other hand, some components, such as optical devices, require a higher signal amplitude because of the relatively high forward voltage drop, which is inherent to this technology. The impedance between the connection point of the bond wire and the reference point also varies over a wide range depending upon the circuitry on the microelectronic chip and the technology employed to implement this circuitry. It may change between different bond pads on the same die and also depend on the bonding sequence.

Traditionally, lead frames used to be made of conductive material and were connected to chassis ground of the machine over the mechanical parts that hold the lead frames in place. In recent years, however, a substantial percentage of designs have been introduced where the traditional conductive lead frame has been replaced by a non-conductive substrate. With this type of substrate it is more difficult to perform a bond failure detection.

SUMMARY OF THE INVENTION

The present invention aims to provide a new and useful method and apparatus for detecting bonding faults, and suitable for use with a large variety of circuits to be processed.

In general terms, the present invention proposes that a monitoring device forms an electric circuit including the bond wire, measures an electric signal at a point in the circuit during at least one stage of a bonding process, and generates from the measurement an output which discriminates between successful and unsuccessful bonding. The monitoring device employs at least one variable parameter during the measuring and/or discriminating process. The value of the variable parameter(s) is determined beforehand by monitoring one or more examples of actual wire bonding operations (including successful examples) to find parameter value(s) associated with successful bonding, Thus, the detection method may adapt to changing requirements automatically and operate under optimal conditions for a large variety of circuits to be processed, e.g. for any given die or substrate.

The present invention is applicable for measuring bonding faults of bond wire which connects a first contact surface (a particular example is a die pad) to a second contact surface. Typically, the second contact surface is a surface of a "substrate" as defined above, e.g. a lead frame. Alternatively, the second contact surface may be another die pad (a possibility mentioned in U.S. Pat. No. 5,328,079). The words "first" and "second" as used here do not necessarily imply an order for the bonding processes.

Preferably the monitoring process includes applying an oscillating voltage to a combination of a load and the bond wire in series, and analysing a voltage derived from the bond wire during stages of the bonding process. Using an AC signal, rather than a DC signal, allows the detection method to be applied to a wider range of devices than is possible using the prior art devices described above which employ a DC signal. This is because the chip (die) impedance (ZD) is not purely resistive, but also has a capacitive component, and because there is a certain capacitance between the silicon die and the reference point. This is advantageous if the resistive component of ZD is very high, which is in particular the case when the substrate is made of nonconductive material.

Preferably, the measurement includes a measurement of an amplitude of the voltage signal (e.g. peak amplitude or RMS amplitude). Preferably the frequency of the voltage signal is predetermined, or is controlled by the monitoring device, rather than being a measured parameter.

In some embodiments, the monitoring device measures the phase of the voltage signals, instead of, or in addition to, their amplitude.

The invention may be used to monitor a wiring process including in which each of a plurality of first contact surfaces are connected to respective second contact surfaces. In this case, optimal parameters may be found for each pair of contact surfaces (e.g. for each bond pad on the die and each bonding point on a substrate). Alternatively, the process of forming any combination of these bonds may be performed using the same parameters, if it is determined that the accuracy of the monitoring is not significantly reduced.

The values of the parameters may be stored in memory and recalled when the particular wire connection is to be monitored.

DESCRIPTION OF THE EMBODIMENTS

Figure 1:
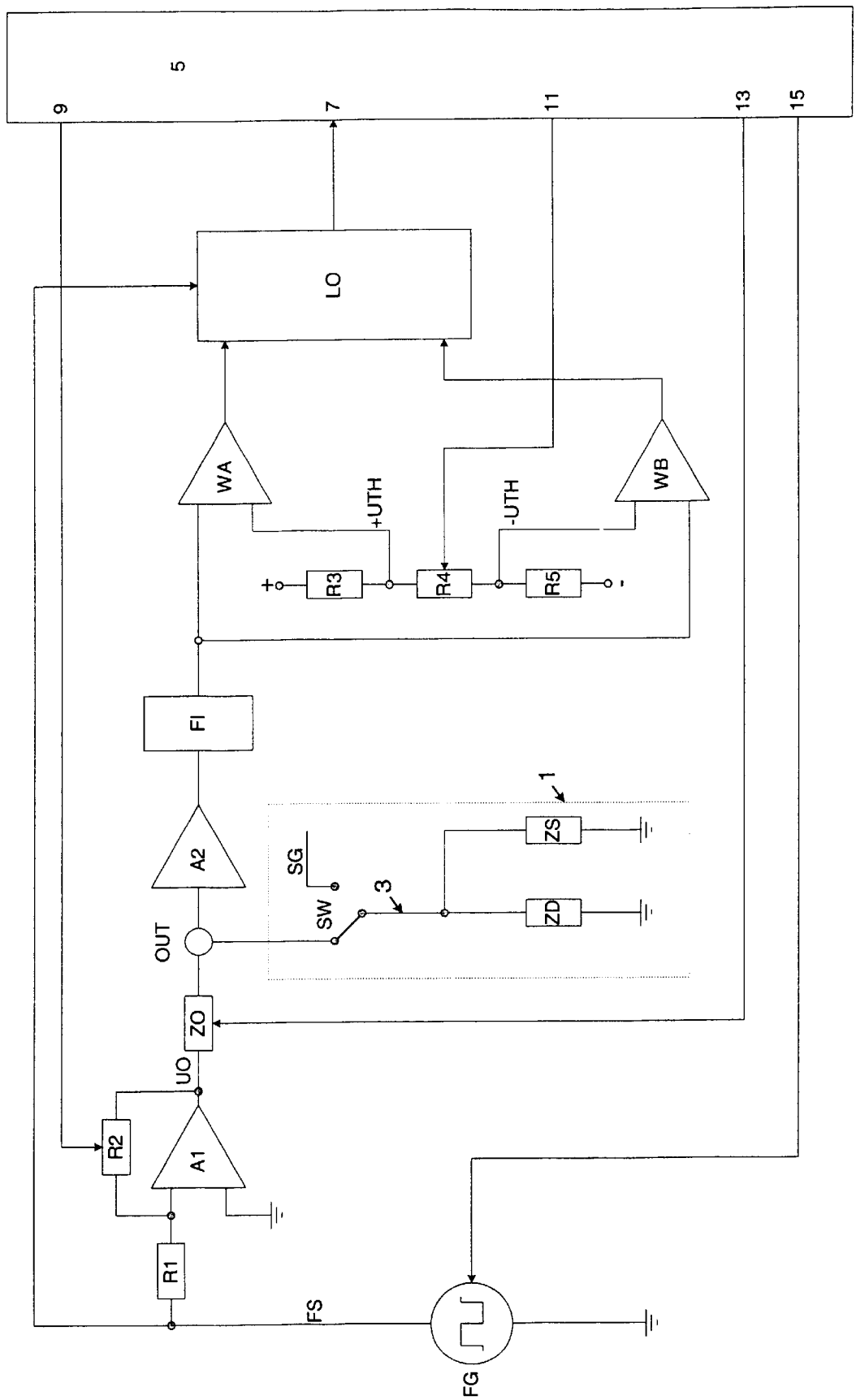
FIG. 1 shows a first embodiment of the invention, in combination with a known bonding apparatus.

FIG. 1 shows a block diagram of a first embodiment of a monitoring device according to the invention. The dashed box 1 represents other parts of the bonding apparatus, as explained below.

The device includes a square wave generator FG generating a square wave FS relative to the reference point (chassis ground) to which the generator FG is also connected. It is envisaged that the frequency of FS may be of the order of 2 kHz. The square wave FS is fed into an amplifier A1 with a variable gain determined by resistor R1 and the setting of the variable resistor R2. It is envisaged that the peak value of UO may be of the order of 5V. The output voltage UO of this amplifier is fed through a variable resistance ZO to the output OUT. The value of ZO may be in the range 200 kOhms to 1.2.M Ohms, for example.

The point OUT is electronically connected to the bonding wire. In the application of the invention shown in FIG. 1, the bonding apparatus includes a switch SW, and the point OUT is connected via the switch SW to the bond wire at a connection point represented by point 3. The switch SW selectively connects the bond wire 3 to the monitoring device of the invention at times when the bond is to be monitored, and to the spark generator during the time a ball is melted at the wire's end. Note, however, that the monitoring device of the embodiment also has applications in other wire bonding apparatus, such as wire bonding apparatus which does not employ ball bonding (e.g. ultrasonic bonding apparatus), and hence in which the switch SW may be omitted and the point OUT connected to the wire 3 at all times.

The impedance marked as ZD schematically denotes the impedance between the connection point 3 of the bond wire and the reference point (chassis ground), while ZS represents the stray impedance of the external connections and the failure detection circuit itself. ZS is essentially an undesired capacitance. ZO and the parallel circuit of ZD and ZS form a voltage divider between the point UO and ground. The voltage at OUT is sampled over a buffer amplifier A2 and fed through a filter FI to a window comparator employing units WA, WB, which have respective inputs ±UTH, which thus constitute positive and negative threshold voltages.

Owing to the effect of ZS and ZD, the voltage at OUT will have the shape of a saw tooth waveform. The window comparator compares the positive and negative peaks of the saw tooth waveform with the positive and negative threshold voltages ±UTH. A digital logic circuit LO uses the results to derive a continuity/open signal, which is received by an input 7 of the main control processor 5 of the bonder apparatus. In other words, in this embodiment, the control processor 5 is shared between the monitoring device and the bonding apparatus, although in other embodiments they may be separate.

The control processor 5 also has outputs 9, 11, 13, 15 with which it controls, preferably via digital "trimpots" (that is "trimming potentiometers") which are not shown in the figure, the units R2, R4, ZO and FG thereby controlling respectively the variable gain, the thresholds, the output impedance and the frequency. The frequency, for example, may be chosen depending on the impedance of the device being processed, the stray impedance of the system, and the required speed for the failure detection. Since the appropriate impedance ZO may be in the range of MOhms, however, it may be impractical to use a digital trimpot to control it, and instead ZO may be varied as a mechanical trimpot, or a series of resistors which can be shorted by jumpers or preferably solid state relays. Working with a variable frequency FS allows a higher degree of flexibility when dealing with a wide range of die and stray impedance. The processor 5 is further provided with a memory (not shown) to which it can write suitable values, and from which it can read parameters to control the variable elements of the monitoring device.

Figure 2:
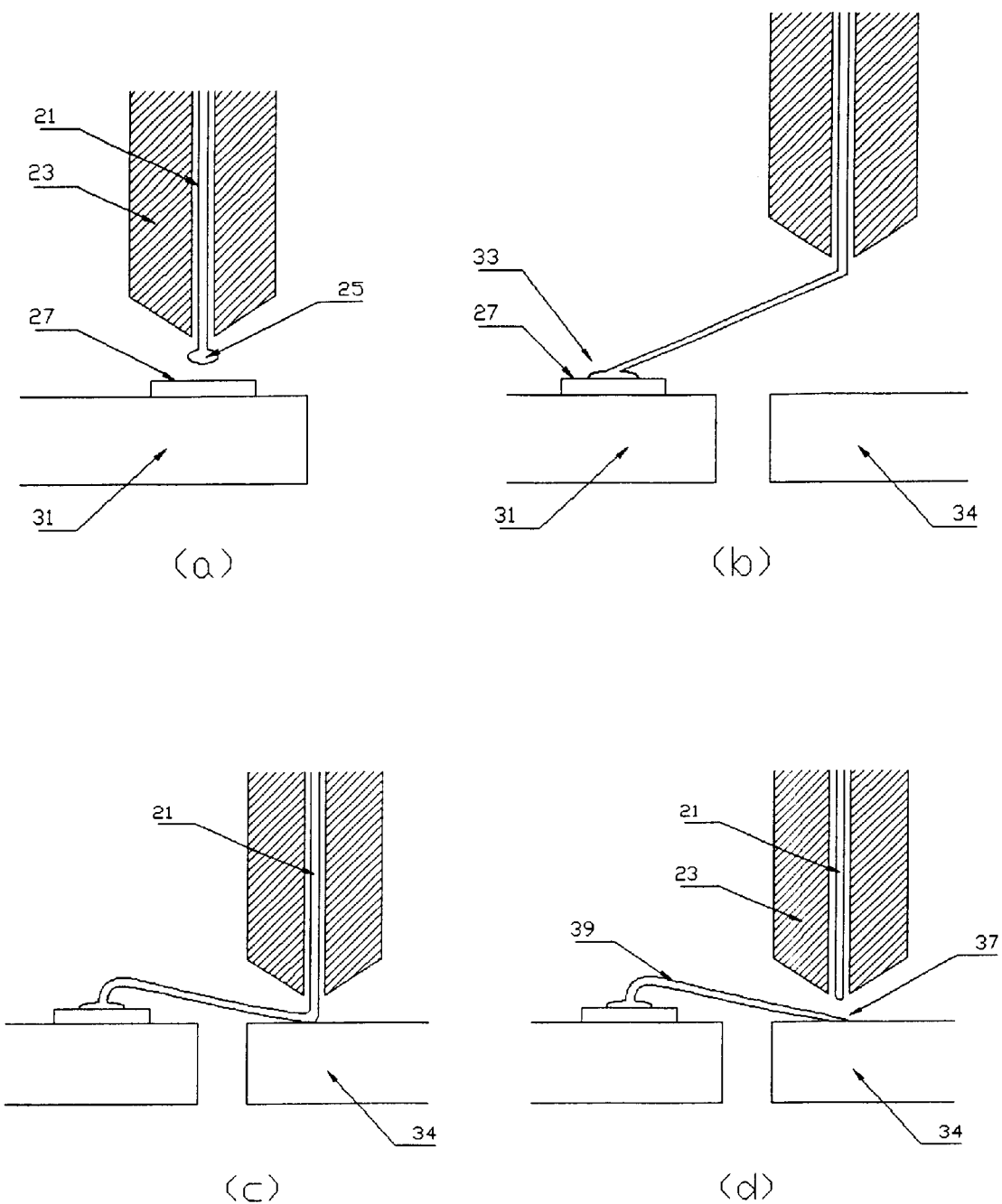
FIG. 2, which is composed of FIGS. 2(a)–2(d), shows the stages of a known bonding process, which can be monitored using the embodiment of FIG. 1.

A known ball bonding process is as illustrated in FIG. 2. As shown in FIG. 2(a) a wire 21 inside a bonding tool 23 is provided with a ball 25 at its end. The bonding tool 23 is moved so that the ball joins a pad 27 formed on a die 31. A junction 33 is formed between the wire 21 and the pad 27. Subsequently, as shown in FIG. 2(b), the bonding tool 23 is moved away towards a substrate 34 (which may be a lead frame). As shown in FIG. 2(c), the bonding tool moves to bring the wire 21 into contact with substrate 34. The bonding tool is then withdrawn, as shown in FIG. 2(d), leaving a junction 37 between a portion of the wire and the substrate 34.

We now describe the learning cycle for the first embodiment.

For the majority of applications, the signal frequency FS and the output impedance ZO need not be varied during the learning cycle. They can be set at the beginning of the process based on the knowledge of the properties of the die and lead-frame being processed, the stray impedance ZS and previous experience. The main parameters to be optimised are the output voltage UO of A1 and the threshold voltages ±UTH of the window comparator.

In the following, various measurements of the voltage at point OUT are discussed. What is meant by this voltage is the peak voltage of the saw tooth waveform. The values of voltage at OUT are measured by the following two steps.

1) The measurement of voltage at OUT is generally performed by varying the threshold voltages until the continuity/open signal changes its state, taking into account the hysteresis of the window comparator.
2) The measurement values are recorded in memory.

The first step of the monitoring is the stage shown in FIG. 2(a), namely the input voltage OUT is measured under no-load conditions, i.e. when the bond wire neither touches the chip nor the substrate. We denote this voltage by OUT0.

The second step is to move the bonding tool down to the die with the bond wire in place and touch the first connection point on the chip. At the stage shown in FIG. 2(b), the voltage at OUT is measured again, and we denote it by OUT1. This voltage would be expected to be lower than OUT0.

In a third step the bonding tool is then moved as during a normal bonding operation to the second bond point on the substrate, as shown in FIG. 2(c). Again, the voltage OUT is measured, and it is denoted by OUT2. When the substrate is made of conductive material, the impedance ZD will be very low at this point and so will be OUT2. However, if the substrate is of the non-conductive type, the impedance ZD will be much higher and OUT2 may be close to OUT1.

In a fourth step the bonding tool is moved upwards and the wire severed, as shown in FIG. 2(d). The impedance and thus the voltage OUT should now be the same as under the no-load conditions, unless the second bond was not made properly and the wire was lifted off the substrate together with the bonding tool while it was still attached to the first bond.

In other words, a successful bonding operation is characterised by the peak voltages OUT1 and OUT2 at steps 2(b) and 2(c) being less than OUT0, and the voltage at OUT reverting to OUT0 at step 2(d).

Whether it is necessary to include all bond points of a particular component in the measurement process or whether the sampling can be limited to a certain number, depends on the design of the device and the judgement of the user.

Depending on the initial settling of UO and the impedance encountered, UO may be varied now and the whole cycle repeated until satisfactory results have been achieved. Specifically, UO may be initially set to a predefined value, e.g. 3V (this predefined voltage might be lower if it were considered hazardous to the circuitry on the chip). UO may then be increased incrementally if OUT1 is equal to or only marginally lower than OUT0 although a good bond has been made, e.g. until the difference between these two reaches a predetermined value. Thus, the value of UO reached eventually represents a minimum value for which bonding failure detection can be performed reliably (with a degree of confidence related to the predetermined minimum difference between OUT0 and OUT1). During the sampling, unsuccessful bonds are ignored.

After the signal voltages OUT have been measured in the described way, the results are processed in a fifth step by the control processor 5 to determine appropriate threshold values to use in determining the continuity/open condition when the embodiment is used to monitor bonds in the future. In general, the threshold value will be set approximately halfway between the no-load value OUT0 and the measured value of OUT1 or OUT2.

Although it would be possible to set all UOs and the thresholds using a single learning cycle for all bonding processes involved in the overall operation of bonding a die to a substrate, the above procedure may alternatively be repeated for several devices of the same type and average or worst case values can be calculated, out of all the cases in which the bond is satisfactory.

The threshold values for all bond points on the die and the threshold values for all bond points on the substrate can be set individually based on the worst case threshold value found for each point.

Alternatively, the threshold value for all die bond points and the substrate bond points can be fixed at the same value, e.g. according to the worst case conditions. The advantage of this method is that the threshold values do not need to be changed during the bonding process.

A further alternative, is to set the threshold values for most points on the die and the substrate to a certain average value and to set the thresholds for the remaining few bond points individually. The advantage of this method as compared to the approach in the preceding paragraph is that it is more robust if there is only a small margin between the no-load threshold and the worst-case threshold.

Figure 3:
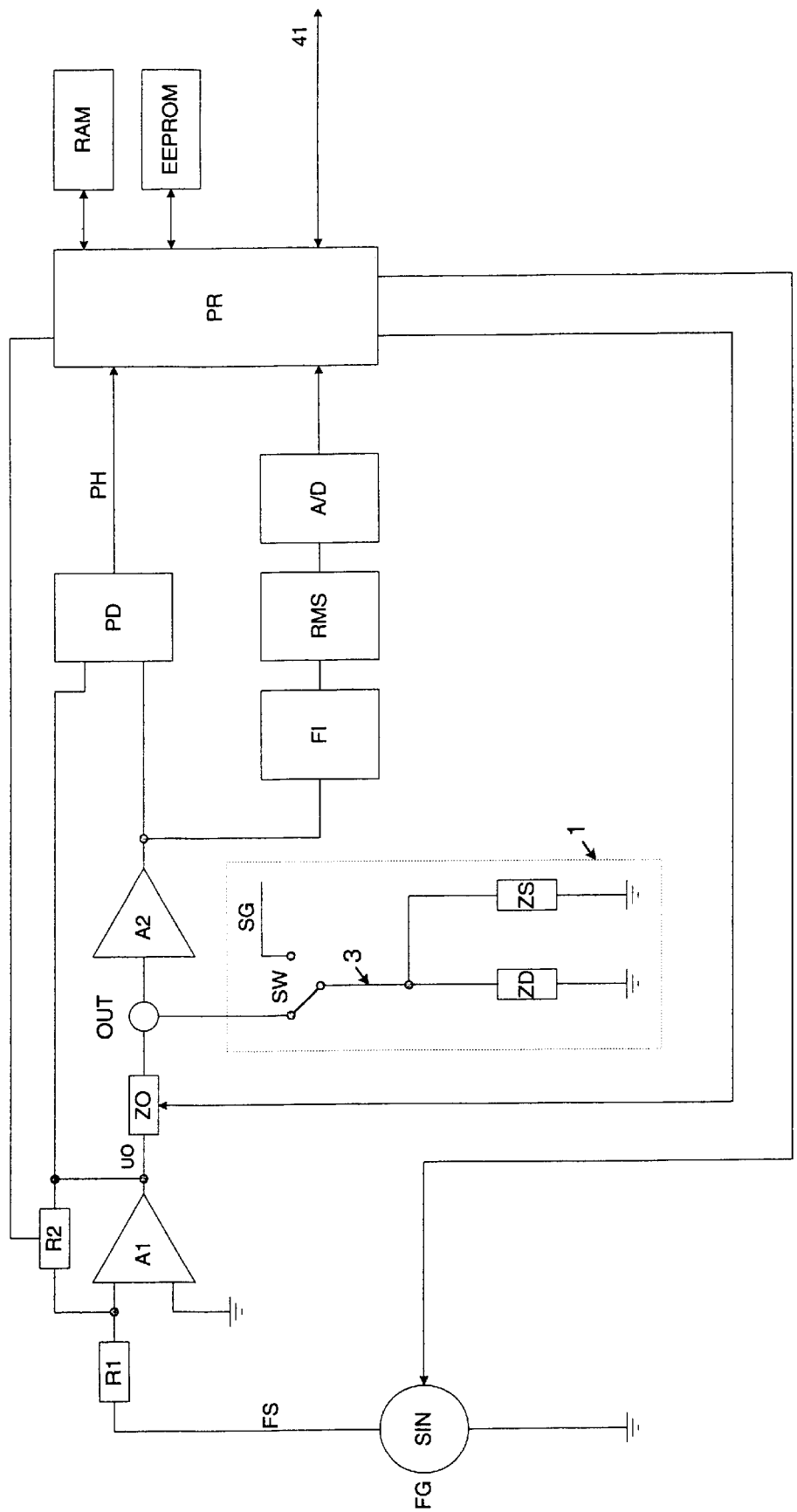
FIG. 3 shows a second embodiment of the invention, in combination with a known bonding apparatus.

FIG. 3 shows a block diagram of a second embodiment, in combination with the bonding apparatus, which is shown schematically by box 1 and is equivalent to that explained above with reference to FIGS. 1 and 2. In FIG. 3 the components of the second embodiment corresponding to those of the first embodiment are given the same labels. A sine wave signal FS generated by a sine wave generator FG is fed into an amplifier A1 with variable gain determined by resistor R1 and variable resistor R2. The output voltage UO of this amplifier is through a variable resistance ZO connected to the output OUT. As explained with reference to FIG. 1, point OUT is connected via a switch SW to the bond wire at connection point 3.

The divided voltage at point OUT is sampled by a buffer amplifier A2 and fed through a filter F1 to an RMS converter. The result is converted to a digital signal by an analogue-digital converter A/D. The buffered input voltage from A2 is also fed, together with the voltage UO, into a phase discriminator PD. The phase PH between these two voltages is input to the processor PR.

From all these results, the external impedance of ZS and ZD can be determined. This processor PR evaluates the measurement results and derives a continuity/open signal 41, which is passed to the main control processor of the machine (not shown). The processor PR controls the variable gain via resistance R2 using a digital trimpot (not shown). The output impedance ZO is controlled by the processor PR in the same way as by the processor 5 in the first embodiment, preferably using relay switched resistors in order to make manual intervention unnecessary. The frequency generator FG is preferably built using a DDS chip (Direct Digital Synthesizer), which is also controlled by the processor PR.

The second embodiment further includes an EEPROM which is a part of the bond failure detection device, but to which the main processor PR has access. The main processor stores relevant data (RMS values and phase values for any number of different chips) on hard disk and in its own RAM. The EEPROM holds only those data which are relevant for one particular chip. When another type of chip is processed, it will be reloaded from the main processor. The processor PR can make use of this data. During the learning cycle, further parameters derived by the PR (e.g. parameters used for setting the variable components and parameters used in the logical operation performed by processor PR on its two measurement inputs) are stored in a RAM memory.

The learning cycle of the second embodiment is the same as that of the first embodiment except that instead of extracting thresholds during the learning cycle for use in real monitoring, the processor PR extracts RMS values and phase differences indicative of correct and incorrect bonding, so that these parameters can be used in subsequent monitoring of bonding processes.

Thus, the main differences between the first and second embodiments are that:

1. In the second embodiment, the processor PR which produces the continuity/open signal 41 is also responsible for deriving during the learning cycle the parameters to be used in the measurement cycle.
2. The second embodiment uses phase differences and RMS measurements, rather than peak values to perform monitoring. For example, it is expected that RMS values will be more reliable, being less dependent upon the shape of the waveform.

We claim:

1. A method for monitoring a bonding process in which a bond wire is bonded to a contact surface, the method including:
   (i) recalling from a memory at least one variable parameter associated with bond failure detection;
   (ii) before the bonding process is carried out, establishing an electric circuit including the bond wire, generating an oscillating electric probe signal at a first point in the circuit, and measuring the voltage at a second point in the circuit;
   (iii) after the bonding process is carried out, generating an oscillating electric probe signal at the first point in the circuit, and measuring the voltage at the second point in the circuit; and (iv) estimating from the measurements whether the bonding process was satisfactory;

steps (ii) and (iii) and/or step (iv) employing at least one variable parameter recalled in step (i), which may be modified for optimizing the bond failure detection process.

2. A method according to claim 1 in which one of the parameters determines an amplitude of the probe signal at the first point in the electric circuit in steps (ii) and (iii).

3. A method according to claim 1 in which one of the parameters determines a resistance in series with the bond wire in steps (ii) and (iii).

4. A method according to claim 1 in which one of said parameters is a parameter determining a threshold voltage, step (iv) including a determination of whether the voltage at said second point in the circuit is above or below the threshold voltage, the result of the determination being used in deriving said estimate.

5. A method according to claim 1 in which one of said parameters is a phase parameter, step (iv) including a determination of whether the phase difference between the first and second points in the electric circuit is above or below a phase difference determined by the phase parameter, the result of the determination being used in deriving said estimate.

6. A method according to claim 1 in which one of said parameters is a frequency parameter which determined the frequency of the oscillating signal.

7. A method according to claim 1 in which the contact surface is a die pad.

8. A method according to claim 1 in which the contact surface is a substrate.

9. A method according to claim 8 in which the substrate is a lead frame.

10. A method for determining the parameters to be stored in the memory for use in a method according to claim 1, the method including:
 at least once performing the steps of:
  (a) establishing an electric circuit including the bond wire, generating an electric probe signal at the first point in the circuit, and measuring the voltage at the second point in the circuit;
  (b) performing the bonding process successfully;
  (c) generating an electric probe signal at the first point in the circuit, and measuring the voltage at the second point in the circuit; and
  (d) determining the parameters based on said measurements.

11. A method according to claim 10 in which said steps (a)–(c) are performed a plurality of times, said step (d) being performed based on the accumulated measurement results.

12. A method according to claim 11 in which said parameters include an amplitude of the electric probe signal for use in steps (ii) and (iii) of the method of claim 1, said amplitude being a minimum amplitude for which step (iv) of the method of claim 1 is carried out reliably.

13. A method for performing a bonding operation in which a bond wire is bonded to a first contact surface in a first bonding process, the bond wire is bonded to a second contact surface in a second bonding process, and the bond wire is severed to leave a portion remaining between the first and second contact surfaces, the method comprising:
 (i) recalling from a memory at least one variable parameter associated with bond failure detection;
 (ii) before the first bonding process is carried out, establishing an electric circuit including the bond wire, generating an oscillating electric probe signal at a first point in the circuit, and measuring the voltage at a second point in the circuit;
 (iii) after the first bonding process is carried out, generating an oscillating electric probe signal at the first point in the circuit, and measuring the voltage at the second point in the circuit;
 (iv) after the second bonding process is carried out, generating an oscillating electric probe signal at the first point in the circuit and measuring the voltage at the second point in the circuit;
 (v) after the bond wire is severed, generating an oscillating electric probe signal at the first point in the circuit, and measuring the voltage at the second point in the circuit; and
 (vi) estimating from the measurements whether the bonding operation was satisfactory; at least one of steps (i) to (vi) employing at least one variable parameter recalled in step (i), which may be modified for optimizing the bond failure detection process.

14. A method according to claim 13 in which said first contact surfaces is a die pad, and said second surface is a substrate.

15. A method according to claim 14 in which said substrate is a lead frame.

16. A method according to claim 13 in which said first and second contact surfaces are both die pads.

17. A method for performing a plurality of bonding operations, each bonding operation comprising the steps of:
 (i) recalling from a memory at least one respective variable parameter associated with bond failure detection;
 (ii) establishing an electric circuit including the bond wire, generating an oscillating electric probe signal at a first point in the circuit, and measuring the voltage at a second point in the circuit;
 (iii) performing a respective first bonding process in which a bond wire is bonded to a first contact surface;
 (iv) generating an oscillating electric probe signal at the first point in the circuit, and measuring the voltage at the second point in the circuit;
 (v) performing a respective second bonding process in which the bond wire is bonded to a second contact surface;
 (vi) generating an oscillating electric probe signal at the first point in the circuit, and measuring the voltage at the second point in the circuit;
 (vii) a respective step of severing the bond wire to leave a portion remaining between the respective first and second contact surfaces;
 (viii) generating an oscillating electric probe signal at the first point in the circuit, and measuring the voltage at the second point in the circuit; and
 (ix) estimating from the measurements whether that bonding operation was satisfactory;
 wherein for each bonding operation at least one of steps (ii), (iv), (vi), (viii) and (ix) employs at least one variable parameter recalled in step (i), which may be modified for optimizing the bond failure detection process.

18. A method according to claim 17 in which the parameters recalled in step (i) are the same for at least two said bonding operations.

19. A method according to claim 17 in which the parameters recalled in step (i) are different for at least two said bonding operations.

20. An apparatus for monitoring a wire bonding process, the device including:
- a memory device for storing one or more variable parameters associated with bond failure detection to be monitored;
- measuring means for establishing an electric circuit including a bond wire;
- a variable voltage generator for generating an oscillating electric probe signal at a first point in the circuit, said measuring means measuring the voltage at a second point in the circuit; and
- processing means for deriving, using measurements made by the measuring means, a signal indicative of whether the bonding process was satisfactory;
- at least one of the measuring means and the processing means being arranged, when it is required for the monitoring device to monitor a certain bonding process, to receive at least one of the variable parameters associated with bond failure detection and to operate based on the received variable parameter, which may be modified for optimizing the bond failure detection process.

21. An apparatus according to claim 20 further comprising means for setting an amplitude of the probe signal at the first point in the electric circuit, according to the value of one of said parameters.

22. An apparatus according to claim 20 further comprising means for setting the value of a resistance in series with the bond wire, according to the value of one of said parameters.

23. An apparatus according to claim 20 in which said processing means is arranged to discriminate whether the voltage at said second point in the circuit is above or below a predetermined threshold voltage, the threshold voltage depending upon one of said parameters.

24. An apparatus according to claim 20 in which said processing means is arranged to discriminate whether the phase difference between the first and second points in the electric circuit is above or below a predetermined phase difference, the predetermined phase difference depending on one of the parameters.

25. An apparatus according to claim 20 further comprising means to generate said probe signal at a frequency which depends on one of the parameters.

26. A wire bonding system including:
- bonding means for performing a wire bonding process; and
- a monitoring device,
- said monitoring device including:
  - a memory device for storing one or more variable parameters associated with bond failure detection to be monitored;
  - measuring means for establishing an electric circuit including a bond wire;
  - a variable voltage generator for generating an oscillating electric probe signal at a first point in the circuit, said measuring means measuring the voltage at a second point in the circuit; and
  - processing means for deriving, using measurements made by the measuring means, a signal indicative of whether the bonding process was satisfactory;
- at least one of the measuring means and the processing means being arranged, when it is required for the monitoring device to monitor a certain bonding process, to receive at least one of the variable parameters associated with bond failure detection and to operate based on the received parameter, which may be modified for optimizing the bond failure detection process.

27. An apparatus for monitoring a wire bonding process, the device including:
- a memory device for storing one or more variable parameters associated with bond failure detection to be monitored;
- measuring means for establishing an electric circuit including a bond wire, generating an oscillating electric probe signal at a first point in the circuit, and measuring the voltage at a second point in the circuit; and
- processing means for deriving, using measurements made by the measuring means, a signal indicative of whether the bonding process was satisfactory, said processing means being arranged to discriminate whether the phase difference between the first and second points in the electric circuit is above or below a predetermined phase difference, the predetermined phase difference depending on one of the parameters;
- at least one of the measuring means and the processing means being arranged, when it is required for the monitoring device to monitor a certain bonding process, to receive at least one of the variable parameters associated with bond failure detection and to operate based on the received variable parameter, which may be modified for optimizing the bond failure detection process.

* * * * *